(12) United States Patent
Hayashi et al.

(10) Patent No.: US 7,816,212 B2
(45) Date of Patent: Oct. 19, 2010

(54) METHOD OF HIGH VOLTAGE OPERATION OF A FIELD EFFECT TRANSISTOR

(75) Inventors: Yutaka Hayashi, 3-10, Umezono 2-chome, Tsukuba-shi, Ibaraki 305-0045 (JP); Hisashi Hasegawa, Chiba (JP); Yoshifumi Yoshida, Chiba (JP); Jun Osanai, Chiba (JP)

(73) Assignees: Seiko Instruments Inc. (JP); Yutaka Hayashi (JP)

( * ) Notice: Subject to any disclaimer, the term of this patent is extended or adjusted under 35 U.S.C. 154(b) by 0 days.

(21) Appl. No.: 12/283,638

(22) Filed: Sep. 12, 2008

(65) Prior Publication Data

US 2009/0014816 A1 Jan. 15, 2009

Related U.S. Application Data

(62) Division of application No. 11/063,468, filed on Feb. 22, 2005, now Pat. No. 7,432,568.

(30) Foreign Application Priority Data

Feb. 24, 2004 (JP) ............................. 2004-048668
Nov. 2, 2004 (JP) ............................. 2004-318750

(51) Int. Cl.
*H01L 21/8234* (2006.01)

(52) U.S. Cl. ...................................... 438/275; 438/197

(58) Field of Classification Search ................. 438/197, 438/275
See application file for complete search history.

(56) References Cited

U.S. PATENT DOCUMENTS

| | | | | | |
|---|---|---|---|---|---|
| 3,999,210 | A | * | 12/1976 | Yamada | 257/364 |
| 4,141,023 | A | * | 2/1979 | Yamada | 257/364 |
| 5,208,477 | A | * | 5/1993 | Kub | 257/421 |

* cited by examiner

*Primary Examiner*—Long Pham
(74) *Attorney, Agent, or Firm*—Adams & Wilks (57) ABSTRACT

A high voltage operating field effect transistor has a substrate and a semiconductor channel formation region disposed in a surface of the substrate. A source region and a drain region are spaced apart from each other with the semiconductor channel formation region disposed between the source region and the drain region. A gate insulating film region is disposed on the semiconductor channel formation region. A resistive gate region is disposed on the gate insulating film region. A source side electrode is disposed on a source region side of the resistive gate region and is operative to receive a signal electric potential. A drain side electrode is disposed on a drain region side of the resistive gate region and is operative to receive a bias electric potential an absolute value of which is equal to or larger than that of a specified electric potential and which changes according to an increase or decrease in a drain electric potential.

12 Claims, 6 Drawing Sheets

METHOD OF HIGH VOLTAGE OPERATION OF A FIELD EFFECT TRANSISTOR

CROSS-REFERENCE TO RELATED APPLICATIONS

This application is a divisional application of U.S. patent application Ser. No. 11/063,468 filed Feb. 22, 2005 now U.S. Pat. No. 7,432,568 and claiming a priority date of Feb. 24, 2004.

BACKGROUND OF THE INVENTION

1. Field of the Invention

The present invention relates to high voltage operating field effect transistors, bias circuits for the transistors and high voltage circuits having the transistors. The high voltage operating field effect transistor is a transistor which operates at a voltage an absolute value of which is larger than that of a withstand voltage of a transistor designed for a standard power supply voltage in an IC or an LSI.

2. Description of the Related Art

Figure 1:
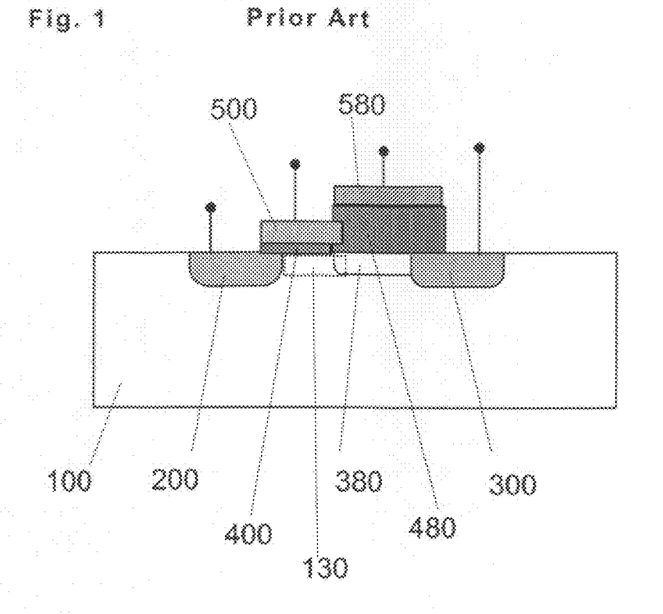
FIG. 1 is a schematic cross sectional view showing a structure of a conventional high withstand voltage MOS transistor.
Figure 2:
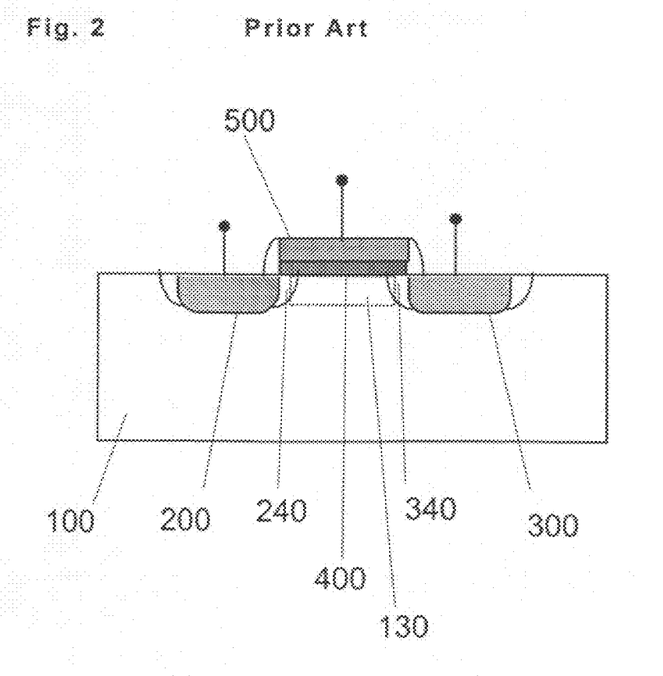
FIG. 2 is a schematic cross sectional view showing a structure of a MOS transistor having a gate length of a small size.

In a conventional high voltage field effect transistor, as shown in FIG. 1, a high withstand voltage drain region 380 or a field plate 580 biased at a high electric potential is provided on a high withstand insulating film 480 to improve a drain withstand voltage. When a gate length of a field effect transistor used as a standard transistor in an MOSIC or an MOSLSI becomes a small size equal to or smaller than submicron, as shown in FIG. 2, a design is made such that the field effect transistor is provided with a lightly doped drain region called a lightly doped drain (LDD) or a drain extension 340 so as to withstand a standard power supply voltage. However, the high withstand voltage drain region requires an impurity concentration lower than that of the lightly doped drain region, a length or depth larger than that of the lightly doped drain region, or both of them or all of them. For this reason, in JP 2002-314044 A, a high withstand voltage region is formed by combining three regions which are different in impurity concentration and junction depth from each other. Note that, in FIGS. 1 and 2, reference numeral 100 designates a semiconductor substrate, reference numeral 200 designates a source region, reference numeral 300 designates a drain region, reference numeral 400 designates a gate insulating film, and reference numeral 500 designates a conductive gate.

In this case, when the high withstand voltage field effect transistors are integrated into an IC or an LSI, additional photo masks and additional manufacturing processes for forming a high withstand voltage insulating film and a high withstand voltage drain region are required, which leads to high cost. In addition, though increased high withstand voltage is possible for a transistor having such a structure, reduction of a driving current becomes a problem. Also, while a channel length of a field effect transistor for a standard voltage having the drain extension structure or the LDD structure can be increased to improve the withstand voltage, a degree of the improvement is low, and the driving current decreases nearly inversely proportional to the channel length. When a gate insulating film of this field effect transistor for a standard voltage is used, the withstand voltage of the field effect transistor is limited by a withstand voltage as well of this insulating film. Moreover, in case of a transistor which is formed in a semiconductor thin film on an insulating substrate such as silicon on insulator (SOI), a high electric field is concentrated in the thin film at a drain end of a channel. Thus, increasing a drain withstand voltage and maintaining a large output current by using the prior art are even more difficult than in the case of the transistor formed in the semiconductor substrate.

SUMMARY OF THE INVENTION

In light of the foregoing, it is an object of the present invention to form a high voltage operating field effect transistor in an IC or in an LSI by utilizing a transistor structure portion or a process technique for a standard transistor operating under a standard power supply voltage in the IC or in the LSI.

In order to attain the above-mentioned object, in the present invention, a measure is taken such that electric potential distribution in which an absolute value of an electric field increases towards a drain is provided in a gate in order to increase an operating voltage of a field effect transistor (hereinafter referred to as "a high voltage operating field effect transistor" for short).

To this end, a first solving means adopts the following structure and bias condition.

That is, a high voltage operating field effect transistor includes at least: a substrate; a semiconductor channel formation region provided in a surface of the substrate; a source region and a drain region which are spaced apart from each other with the semiconductor channel formation region between the source region and the drain region; a gate insulating film provided on the semiconductor channel formation region; a resistive gate provided on the gate insulating film; and a source side electrode provided on a source region end portion side of the resistive gate, and a drain side electrode provided on a drain region end portion side of the resistive gate, in which a signal electric potential is supplied to the source side electrode, and a bias electric potential an absolute value of which is equal to or larger than that of a specified electric potential and which changes according to increase or decrease in a drain electric potential is supplied to the drain side electrode.

Figure 3:
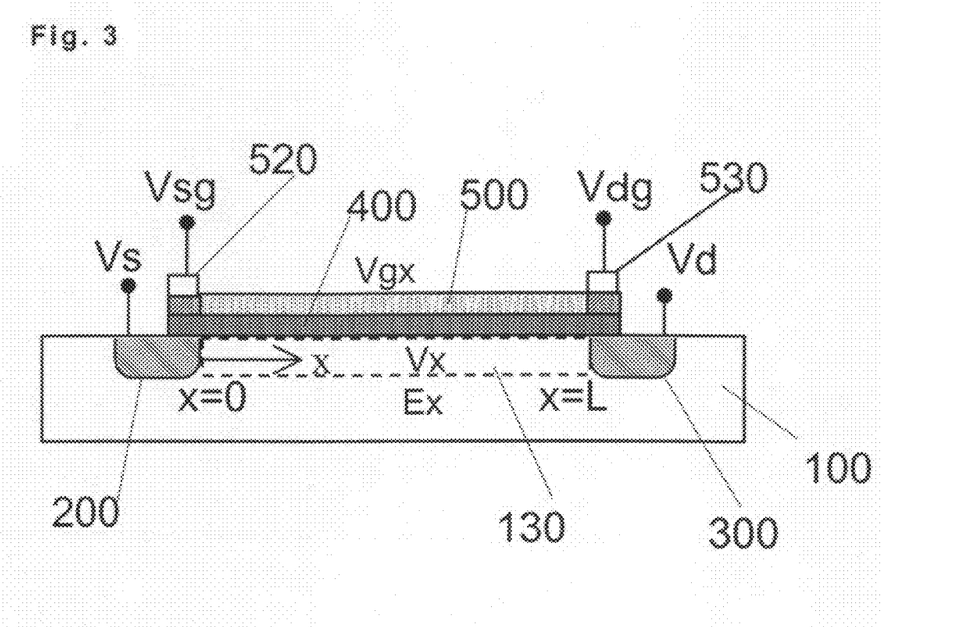
FIG. 3 is a schematic cross sectional view of a field effect transistor explaining a first solving means according to the present invention.

That is, as shown in FIG. 3, a gate 500 is made of a resistive material, a source side electrode 520 is provided on a source region 200 side of the gate, and a drain side electrode 530 is provided on a drain region 300 side of the gate. A signal electric potential Vg which is conventionally supplied to a gate of a conventional field effect transistor is supplied as a source side gate electric potential Vsg to the source side electrode 520, and "an electric potential Vd1 an absolute value of which is equal to or larger than that of a specified voltage and which changes according to increase or decrease in a drain electric potential" is supplied as a drain side gate electric potential Vdg to the drain side electrode 530. The electric potential Vd1 is an electric potential which is closer to the drain electric potential Vd than a source electric potential Vs, and will be described in detail later.

Figure 4:
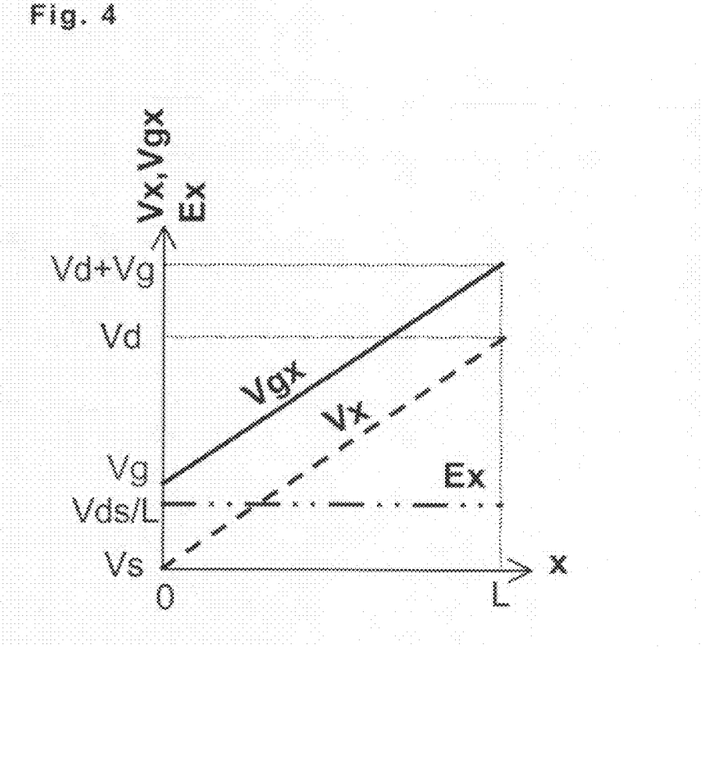
FIG. 4 is a graphical representation showing a relationship among a gate electric potential, a channel electric potential, and a channel electric field distribution, explaining a high voltage operation by the first solving means according to the present invention.

In case of Vdg=Vd+Vg, when the electric charges in the depletion layer of a channel formation region 130, or a so-called back gate effect in case of an SOI substrate can be disregarded, as shown in FIG. 4, a gate electric potential Vgx and a channel electric potential Vx at a distance x from a source edge show the same change. Hence, an electric field within a channel becomes nearly a constant value of Vds/L (Vds=(Vd−Vs): L is a channel length). Consequently, a drain withstand voltage can be realized up to a value near a maximum value of Ec×L determined by a product of a breakdown electric field Ec of a semiconductor and a channel length L. A difference in electric potential between the gate and the source in each of points in the channel also becomes nearly a constant value (Vg−Vs), and hence no large electric potential difference locally occurs. For this reason, the withstand voltage required for the gate insulating film has not to be so high as to be required for the drain withstand voltage, and hence the high voltage operation can be realized with a thickness of a standard gate insulating film within an IC or an LSI. However, in real, the withstand voltage concerned is limited by a drain to substrate junction withstand voltage smaller than the maximum value of Ec×L.

Note that while this structure and a bias condition of Vdg=(Vd+Vg) is known as a method of realizing a variable resistor described in reference 1, "Resistive Gate Variable Resistor", by Yutaka Hayashi, Kenji Nakahara, and Yasuo Tarui, Bulletin of Electrotechnical Laboratory, Vol 40, Nos. 4 and 5, pp. 73 to 81, they are not disclosed therein as a structure for realizing the high voltage operation. Moreover, as will be described below, even if the bias electric potential is out of the bias condition of Vdg=Vd+Vg, the sufficiently high voltage operation is realized. In addition, even when the request for the gate structure is not so severe as the condition disclosed in the reference 1, the effect of the high voltage operation can be obtained. That is, in the reference 1, it is required for the purpose of realizing an excellent linear variable resistor that a source side electrode and a drain side electrode contact a resistive gate only in places above a source region and a drain region, and the contact portions be aligned with a boundary with a channel formation region. However, in the present invention, the source side electrode and the drain side electrode may contact the resistive gate so as to form extension overlap above the semiconductor channel formation region. If anything, in the present invention, when the contact portion between the source side electrode and the resistive gate extends up to a place above the semiconductor channel formation region, this is more advantageous in terms of the design of a gain.

While a similar structure is disclosed in JP, 06-069500,A (1994) for the purpose of making an effective channel length variable, this structure is not utilized as a structure for realizing the high voltage operation. In addition, the bias electric potential condition of the present invention is not disclosed therein.

In the foregoing, Vdg=Vd+Vg=Vd1 is the electric potential supply condition in the ideal case. However, even when a value Vd2 which is obtained by subtracting Vg from Vd1 is not just Vd itself, if the value Vd2 is a value equal to or larger than Vd or a value equal to or smaller than Vd, the high with stand voltage effect appears as long as the value Vd2 represents the electric potential which is nearer Vd than Vs and which changes according to increase or decrease in an increase or a decrease in Vd.

Even if the high voltage operating field effect transistor of the present invention is formed in a semiconductor substrate, or even if the high voltage operating field effect transistor of the present invention is formed in an SOI substrate, when an influence of the electric charges in the depletion layer of the semiconductor substrate, or the back bias effect from the substrate exerted on the output characteristics cannot be disregarded, the distribution of the electric field within the channel becomes uniform in a case where Vd2 is replaced with (Vd+Vth2−Vth1) instead of Vd. Vth1 represents a gate threshold voltage at the source edge of the channel, and Vth2 represents a gate threshold voltage at the drain edge of the channel. Vth1 and Vth2 change in accordance with Vs and Vd, respectively.

In such a manner, returning from the ideal case back to the actual problem, it is not necessarily a wise policy to strictly establish a relation of Vd2=Vd depending on the secondary effect of the transistor itself and the characteristics of a bias electric potential supplying circuit in many cases. If Vd2 increases or decreases in accordance with the drain electric potential while an absolute value of the drain electric potential is large, both the electric field at the drain edge of the channel and the electric potential of the gate insulating film are relaxed, and hence it is possible to realize the high voltage operating field effect transistor.

In addition, even when Vd1 is replaced by Vd2 containing no Vg, or even if Vg contained in Vd1 is replaced with the first constant electric potential Vs1 equal to or lower than a power supply electric potential within an IC or an LSI, the high withstand voltage effect appears. It is because the gate insulating film almost withstands a voltage obtained by adding the design margin to the power supply voltage within an IC or an LSI for a difference in electric potential between the drain side electrode and the drain. Normally, two kinds of standard transistors, i.e., a standard transistor for internal logic and a standard transistor for an external interface are prepared in many cases. Therefore, when the high voltage requirement has precedence over the current capacity, it is possible to apply the gate insulating film thickness and voltage for an external interface to a transistor of the present invention.

Moreover, in the present invention, a measure is taken such that when the drain electric potential is made small, Vd1 is held at Vg or the first constant electric potential Vs1 irrespective of a change in Vd to prevent reduction of the drain current.

In the present invention, Vg or Vs1 is called "a specified electric potential", Vd2 is called "an electric potential which changes according to increase or decrease in a drain electric potential", and Vd1 is called "a bias electric potential an absolute value of which is equal to or larger than that of a specified electric potential and which changes according to increase or decrease in a drain electric potential.

A structure of a second solving means is as follows.

That is, a high voltage operating field effect transistor includes at least: a substrate; a source region and a drain region which are spaced apart from each other in a surface of the substrate; a semiconductor channel formation region provided in the surface of the substrate, between the source region and the drain region; a plurality of division gates obtained through division in a source/drain direction and provided above the semiconductor channel formation region; and a plurality of gate insulating films provided between the semiconductor channel formation region and the plurality of division gates, in which: each of the plurality of division gates is resistive and has two end portions in a direction crossing the source/drain direction, adjacent division gates in the two end portions are alternately connected to each other along a source/drain direction to form one meandered gate, and a source side electrode and a drain side electrode are provided in a source side end portion and a drain side end portion, respectively; and a signal electric potential is supplied to the source side electrode, and a bias electric potential an absolute value of which is equal to or larger than that of a specified electric potential and which changes according to increase or decrease in a drain electric potential is supplied to the drain side electrode.

A structure of Modification 1 of the second solving means is as follows.

That is, a high voltage operating field effect transistor includes at least: a substrate; a source region and a drain region which are spaced apart from each other in a surface of the substrate; a semiconductor channel formation region provided in the surface of the substrate, between the source region and the drain region; a plurality of division gates obtained through division in a source/drain direction and provided above the semiconductor channel formation region;

and a plurality of gate insulating films provided between the semiconductor channel formation region and the plurality of division regions, in which: each of the division gates other than the division gate nearest the source region is resistive and has two end portions in a direction crossing the source/drain direction, adjacent division gates in the two end portions are alternately connected to each other along a source/drain direction to form one meandered gate, and a source side electrode and a drain side electrode are provided in a source side end portion and a drain side end portion, respectively; a signal electric potential is supplied to the division gate nearest the source region; and a specified electric potential is supplied to the source side electrode, and a bias electric potential an absolute value of which is equal to or larger than that of the specified electric potential and which changes according to increase or decrease in a drain electric potential is supplied to the drain side electrode.

In the above-mentioned second solving means and its modification, when the distance between the adjacent division gates is long, the current decreases or the operation becomes unstable in some cases. In order to avoid this state, the following structure is adopted. That is, an intermediate region having the same conductivity type as that of the channel carriers is provided in a channel formation region portion between the plurality of division gates. However, when impurities are added to the semiconductor channel formation region to convert the semiconductor channel formation region into a depletion channel, the intermediate region can be omitted in some cases.

In the second solving means, the ultimately high voltage on the same level as that achieved by the first solving means cannot be realized. However, there is an advantage in that the resistive division gates can be realized by a polycrystalline silicon resistor used in an analog LSI or a polycrystalline silicon gate without silicidation.

A high voltage operating field effect transistor according to Modification 1 of the first solving means, in which the signal supply location in the first solving means is set as the source, adopts the following structure. That is, a high voltage operating field effect transistor includes at least: a substrate; a semiconductor channel formation region provided in a surface of the substrate; a source region and a drain region which are spaced apart from each other with the semiconductor channel formation region between the source region and the drain region; a gate insulating film provided on the semiconductor channel formation region; a resistive gate provided on the gate insulating film; and a source side electrode provided on a source region end portion side of the resistive gate, and a drain side electrode provided on a drain region end portion side of the resistive gate, in which: at least one of a signal electric potential and a signal current is supplied to the source region; and a first constant electric potential is supplied to the source side electrode, and a bias electric potential an absolute value of which is equal to or larger than that of the first constant electric potential and which changes according to increase or decrease in a drain electric potential is supplied to the drain side electrode.

A high voltage operating field effect transistor according to Modification 2 of the second solving means, in which the signal supply location in the second solving means is set as the source, adopts the following structure. That is, a high voltage operating field effect transistor includes at least: a substrate; a source region and a drain region which are spaced apart from each other in a surface of the substrate; a semiconductor channel formation region provided in the surface of the substrate, between the source region and the drain region; a plurality of division gates obtained through division in a source/drain direction and provided above the semiconductor channel formation region; and a plurality of gate insulating films provided between the semiconductor channel formation region and the plurality of division gates, in which: at least one of a signal electric potential and a signal current is supplied to the source region; each of the plurality of division gates is resistive and has two end portions in a direction crossing the source/drain direction, adjacent division gates in the two end portions are alternately connected to each other along a source/drain direction to form one meandered gate, and a source side electrode and a drain side electrode are provided in a source side end portion and a drain side end portion, respectively; and a first constant electric potential is supplied to the source side electrode, and a bias electric potential an absolute value of which is equal to or larger than that of the first constant electric potential and which changes according to increase or decrease in a drain electric potential is supplied to the drain side electrode.

Since there are many modes in the bias circuit for generating an electric potential to be supplied to the drain side electrode, they will be described in "DETAILED DESCRIPTION OF THE PREFERRED EMBODIMENTS" later. However, bias circuits and high voltage operation circuit elements which will be disclosed can be applied not only to the high voltage operating field effect transistors described above but also generally to a high voltage operating field effect transistor with at least a drain, a source and a resistive gate between the drain and source having a drain region side on which a drain side electrode is provided and having a source region side on which a source side electrode is provided.

In order to alleviate a delay of the transient response of the bias circuit, a capacitive element is connected in parallel with a resistor or a rectifying device, or between elements in some cases. While specific examples will be described later, in such cases, the capacitive element is topologically connected between the drain region and the drain side electrode through a wiring or an arbitrary element.

A semiconductor substrate can be used as the substrate in a surface of which the high voltage operating field effect transistor of the present invention is to be formed.

A substrate such as an SOI substrate in a surface of which a semiconductor thin film insulated from a supporting substrate is formed, a glass substrate, or an organic sheet can be used as the supporting substrate on which the high voltage operating field effect transistor of the present invention is to be formed.

Of the high voltage operating circuits to each of which the high voltage operating field effect transistor of the present invention is applied, for use in the bias circuit as well for the high voltage operating field effect transistor of the present invention, a high voltage operating circuit element having the following structure is favorable.

That is, a high voltage operating circuit element includes at least: a first insulated gate field effect transistor; a second field effect transistor complementary to the first insulated gate field effect transistor; a first resistor having one end connected to a drain of the first insulated gate field effect transistor; and a second resistor having one end connected to a source of the first insulated gate field effect transistor, in which: a first electric potential is supplied to the other end of the first resistor, and a second electric potential is supplied to the other end of the second resistor; the second field effect transistor is the high voltage operating field effect transistor according to one of the first solving means and the second solving means of the present invention; a source of the second field effect transistor is connected to the drain of the first insulated gate field effect transistor; the second electric potential is supplied to a drain side electrode of the second field effect transistor, and a source side electrode of the second field effect transistor is connected to the source of the first insulated gate field effect transistor; a gate of the first insulated gate field effect transistor is set as an input; and one point selected from the source and the drain of the first insulated gate field effect transistor is set as an output.

The high voltage operating circuit element adopts the following structure when the high voltage operating field effect transistor according to Modification 1 of the second solving means of the present invention is used.

That is, a high voltage operating circuit element includes at least: a first insulated gate field effect transistor; a second field effect transistor complementary to the first insulated gate field effect transistor; a first resistor having one end connected to a drain of the first insulated gate field effect transistor; and a second resistor having one end connected to a source of the first insulated gate field effect transistor, in which: a first electric potential is supplied to the other end of the first resistor, and a second electric potential is supplied to the other end of the second resistor; the second field effect transistor is the high voltage operating field effect transistor according to the modification 1 of the second solving means of the present invention; a source of the second field effect transistor is connected to the drain of the first insulated gate field effect transistor; the second electric potential is supplied to a drain side electrode of the second field effect transistor, and a division gate nearest a source region of the second field effect transistor and a source side electrode of the second field effect transistor are connected to the source of the first insulated gate field effect transistor; a gate of the first insulated gate field effect transistor is set as an input; and one point selected from the source and the drain of the first insulated gate field effect transistor is set as an output.

In order to ensure the transient response characteristics of the high voltage operating circuit element a capacitive element is connected between the input and the source of the first insulated gate field effect transistor in many cases. In addition, even when a capacitive element is connected between the input and the output, the transient response characteristics can be ensured.

In the present invention, an element such as a pn junction capacitance or a MIS capacitance which is used in an IC can be used as the capacitive element.

The effects of the present invention are as follows:

1. The high voltage operating field effect transistor can be realized by adoption of a cross sectional structure of the transistor developed for the standard voltage, and addition of few gate fabrication processes without forming the high withstand voltage structure having a conventional special cross sectional structure in the transistor (the change of the planar pattern is necessary).

Note that if the combination with the conventional high withstand voltage cross sectional structure is possible, the high voltage operating field effect transistor can operate at a higher voltage.

2. Both the high voltage operation and the driving current can be improved as compared with the transistor the channel length of which is lengthened to improve its withstand voltage.

3. While the bias circuit is required, the high voltage operating field effect transistor can be realized through the manufacturing process prepared for the standard voltage IC. Even if there is a modification, the high voltage operation can be realized by addition of few modifications.

4. If there is an output transistor (normally having a higher voltage capability than the internal voltage) for the standard voltage IC or of the standard voltage LSI, a gate insulating film which is already prepared for the output transistor can be diverted to the gate insulating film for the high voltage operating field effect transistor of the present invention.

5. Consequently, the IC or LSI able to output a high voltage can be manufactured through the standard IC manufacturing line.

6. The field effect transistor which is formed in a semiconductor thin film and typified by a TFT in an SOI substrate, on a glass substrate, or on an organic substrate and which is conventionally difficult to carry out a high voltage operation while ensuring the current capacity can operate at the high voltage.

7. The standard voltage signal area and the high voltage operating area can be separated from each other within the IC or LSI chip by introducing Modification 1 of the first solving means and Modification 2 of the second solving means of the present invention. Thus, it is possible to avoid a danger that the high voltage interconnections are formed within the low voltage operating area, and it is also possible for a signal delay to be suppressed by transmitting the standard voltage signal up to the high voltage operating area with low amplitude.

DETAILED DESCRIPTION OF THE PREFERRED EMBODIMENTS

A description of preferred embodiments of the present invention will hereinafter be mainly given with respect to a case where an n-channel high voltage operating field effect transistor is mainly assumed. If a sign of a voltage relationship is inverted between plus and minus, absolute values are applied to magnitude relationships, and an n type conductivity is inverted to a p type conductivity, the description may also apply to a p-channel field effect transistor.

A high voltage operating field effect transistor according to Embodiment 1 of the present invention, as shown in FIG. 3, includes at least: a substrate 100; a semiconductor channel formation region 130 provided in a surface of the substrate 100; a source region 200 and a drain region 300 which are spaced apart from each other with the semiconductor channel formation region 130 therebetween; a gate insulating film 400 provided on the semiconductor channel formation region 130; a resistive gate 500 provided on the gate insulating film 400; a source side electrode 520 provided on a source side of the resistive gate 500; and a drain side electrode 530 provided on a drain side of the resistive gate 500.

When the source side electrode 520 and the drain side electrode 530 are provided above the source region 200 and the drain region 300, respectively, the gate insulating film 400 is made to extend so as to cover an edge of the source region 200 on the semiconductor channel formation region 130 side, and an edge of the drain region 300 on the semiconductor channel formation region 130 side, or another insulating film is provided under the source side electrode and the drain side electrode.

A source side gate electric potential as a conventional signal electric potential Vg is supplied to the source side electrode 520, and a drain side gate electric potential as an electric potential Vd1 which is closer to a drain electric potential than a source electric potential is supplied to the drain side electrode 530, thereby realizing a high drain withstand voltage.

It is desirable that the resistive gate 500 portion be doped with no impurity, or be formed of a polycrystalline silicon thin film in which an addition amount of impurities is set equal to or less than $10^{18}$ atoms/cm$^3$. The gate portion to which the drain side electrode 530 and the source side electrode 520 are to adhere is doped with the impurities at higher concentration in some cases. Since a diffusion constant at which impurities are diffused into a polycrystalline material is larger than that at which impurities are diffused into a monocrystalline material, a place or a position which is to be doped with impurities is determined in consideration of the difference in diffusion constant.

Figure 5:
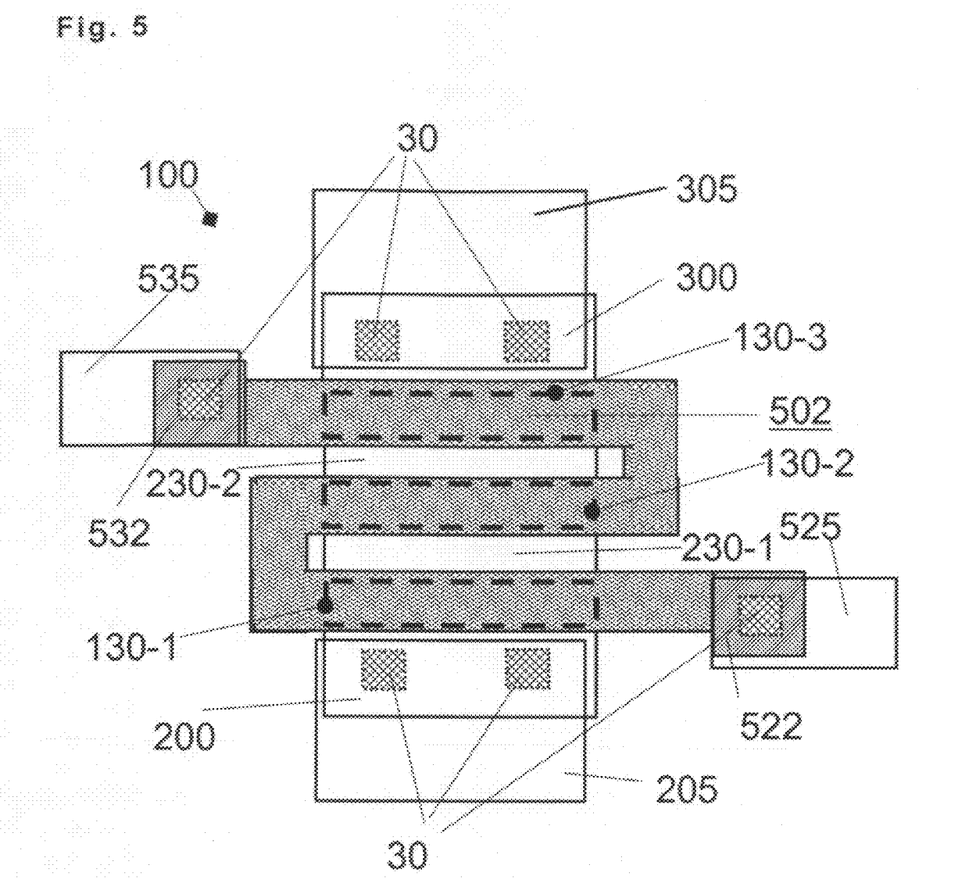
FIG. 5 is a plan view of a field effect transistor, explaining a second solving means according to the present invention.

A high voltage operating field effect transistor according to Embodiment 2 of the present invention, as shown in FIG. 5, includes: a substrate 100; a source region 200 and a drain region 300 which are spaced apart from each other in a surface of the substrate 100; a semiconductor channel formation region 130 (which is divided into parts 130-1, 130-2, and 130-3 since intermediate region 230s are provided in FIG. 5) which is provided in the surface of the substrate 100, between the source region 200 and the drain region 300; and a gate which is provided above the semiconductor channel formation region 130 through a gate insulating film. The gate is divided into division gates in a source/drain direction and is resistive. Also, as shown in a plan view of FIG. 5, adjacent division gates in two end portions in a direction (channel width W direction) crossing the source/drain direction are alternately connected each other along a source/drain direction to obtain one gate 502, a source side electrode 522 is provided on an end portion on the source side, and a drain side electrode 532 is provided on an end portion on the drain side. Similarly to Embodiment 1, a signal electric potential is supplied to the source side electrode 522, and a bias electric potential an absolute value of which is equal to or larger than that of a specified electric potential and which changes according to increase or decrease in a drain electric potential is supplied to the drain side electrode 532, thereby allowing the high voltage operating field effect transistor to be realized.

In this case, since a long distance can be obtained between the drain side electrode 532 and the source side electrode 522, a sheet resistance of the resistive gate portion may be one or more orders of magnitude smaller than that in Embodiment 1 shown in FIG. 3, and hence the resistive gate portion can be formed at the same impurity concentration as that of a polycrystalline silicon resistor of an analog MOSIC, which is favorable.

Note that, in FIG. 5, reference numeral 30 designates a contact hole, reference numeral 205 designates a source interconnection, reference numeral 305 designates a drain interconnection, reference numeral 535 designates a drain side gate interconnection, and reference numeral 522 designates a source side gate interconnection.

Figure 6:
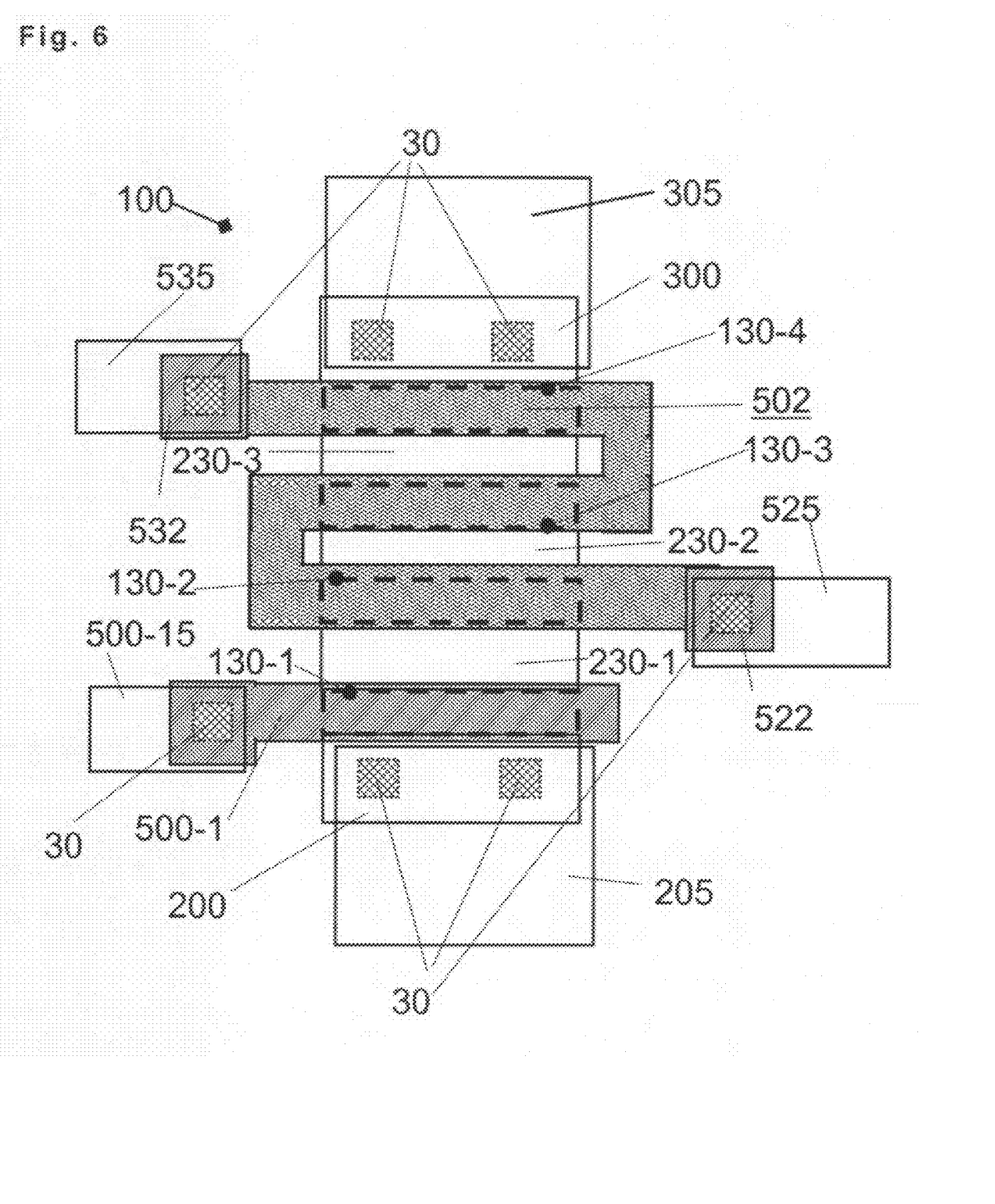
FIG. 6 is a plan view of a field effect transistor, explaining a modification of the second solving means according to the present invention.

Moreover, Modification 1 of Embodiment 2 of the present invention is shown in a plan view of FIG. 6. As shown in the figure, in order to make the circuit design easy, a division gate 500-1 nearest a source region 200 is not connected to another division gate 502, and is made low resistive or conductive in many cases. That is, a high voltage operating field effect transistor according to Modification 1 of Embodiment 1 includes at least: a substrate 100; a source region 200 and a drain region 300 which are spaced apart from each other in a surface of the substrate 100; a semiconductor channel formation region 130 which is provided in the surface of the substrate 100, between the source region 200 and the drain region 300; a plurality of resistive division gates 500-1 and 502 which are obtained through division in a source/drain direction and which are provided above the semiconductor channel formation region 130; and a plurality of gate insulating films which are provided between the semiconductor channel formation region 130 and the plurality of resistive division gates 500-1 and 502, in which: the division gate 502 other than the division gate 500-1 nearest the source region 200 is resistive, adjacent division gates in two end portions in a direction crossing the source/drain direction are alternately connected to each other along the source/drain direction to form one meandered gate 502, and a source side electrode 522 is provided on a source side end portion, and a drain side electrode 532 is provided on a drain side end portion; a signal electric potential is supplied to the division gate 500-1 nearest the source region 200; and a specified electric potential is supplied to the source side electrode 522, and a bias electric potential an absolute value of which is equal to or higher than the specified electric potential and which changes according to increase or decrease in a drain electric potential is supplied to the drain side electrode 532. Thus, it is possible to obtain the high voltage operating field effect transistor.

In this case, the source side electrode 522 and the drain side electrode 532 of the resistive gate are provided on an end portion of the division gate 502 nearer the source region 200, and an end portion of the division gate 502 nearer the drain region 300, respectively.

In FIG. 6, reference numeral 500-15 designates an interconnection extending to the division gate 500-1 through the contact hole 30. The signal electric potential Vg is supplied to the division gate 500-1 through the interconnection 500-15.

The specified electric potential (one of Vs1 and Vg) is supplied to the source side electrode 522 of the gate, and the bias electric potential Vd1 is supplied to the drain side electrode 532 of the gate.

In order to increase high-frequency input impedance, the specified electric potential supplied to the source side electrode 522 can be fixed to Vs1. In this case as well, the withstand voltage improving effect can be attained.

In order to further increase the high frequency characteristics, an element (such as a pn junction capacitor or a MIS capacitor) having a capacitance component can be connected between the source side electrode 522 and an A.C. grounding point.

According to Modification 1, in which the signal supply location is set as the source, of Embodiment 1, there is provided a high voltage operating field effect transistor including at least: a substrate; a semiconductor channel formation region provided in a surface of the substrate; a source region and a drain region which are provided apart from each other with the semiconductor channel formation region therebetween; a gate insulating film provided on the semiconductor channel formation region; a resistive gate provided on the gate insulating film; a source side electrode provided on a source region end portion of the resistive gate; and a drain side electrode provided on a drain region end portion of the resistive gate, in which: at least one of a signal electric potential and a signal current is supplied to the source region; and a first constant electric potential is supplied to the source side electrode, and a bias electric potential an absolute value of which is equal to higher than that of the first constant electric potential and which changes according to increase or decrease in a drain electric potential is supplied to the drain side electrode.

According to Modification 2, in which the signal supply location is set as the source, of Embodiment 2, there is provided a high voltage operating field effect transistor including at least: a substrate; a source region and a drain region which are spaced apart from each other in a surface of the substrate; a semiconductor channel formation region which is provided in the surface of the substrate, between the source region and the drain region; a plurality of division gates which are obtained through division in a source/drain direction and which are provided above the semiconductor channel formation region; and a plurality of gate insulating films which are provided between the semiconductor channel formation region and the plurality of division gates, in which: at least one of a signal electric potential and a signal current is supplied to the source region; each of the division gates is resistive, adjacent division gates in two end portions in a direction crossing the source/drain direction are alternately connected to each other along the source/drain direction to form one meandered gate, and a source side electrode and a drain side electrode are provided on a source end portion and a drain side end portion, respectively; and a first constant electric potential is supplied to the source side electrode, and a bias electric potential an absolute value of which is equal to or higher than that of the first constant electric potential and which changes according to increase or decrease in a drain electric potential is supplied to the drain side electrode.

The source of the high voltage operating electric potential of each of Modification 1 of Embodiment 1 and Modification 2 of Embodiment 2 is connected to a drain of a standard transistor provided inside an IC or an LSI through a conductive interconnection, whereby a standard voltage signal can be converted into a high voltage operating signal.

Moreover, a standard voltage signal area and a high voltage operating area can be separated from each other. Thus, it is possible to avoid a danger that the high voltage interconnection are formed within the low voltage operating area, and it is also possible to suppress a signal delay by transmitting a standard voltage signal up to the high voltage operating area with low amplitude.

In order to attain this, a first constant electric potential Vs1 is selected as a specified electric potential for the gate bias electric potential of the high voltage operating field effect transistor of Embodiment 2.

In the present invention, when there are a plurality of power supply voltages, a voltage with which the driving current value and the withstand voltage become optimal is selected as Vs1. At this time, the gate insulating film thickness which is prepared so as to withstand that voltage in the IC or LSI manufacturing process is used as the insulating film under the resistive gate.

In the present invention, Vd2 in the bias electric potential Vd1 increases or decreases in accordance with an increase or a decrease in Vd. However, Vd2 and Vd do not need to show a linear relationship.

In the above-mentioned second solving means and its modification, if the distance between the adjacent division gates is long, the channel resistance between the adjacent division gates becomes large, and the operation becomes unstable in some cases. Hence, intermediate regions 230 (230-1, ..., 230-($k$–1)) each having the same conductivity as that of the channel carriers are provided in the semiconductor channel formation regions between the adjacent division gates, respectively, in many cases. The provision of the intermediate regions 230-1, ..., 230-($k$–1) divides the semiconductor channel formation region 130 into the semiconductor channel formation regions 130-1, 130-2, ..., 130-$k$.

When each of the source region and the drain region is made of a semiconductor, the intermediate regions 230-1, ..., 230-($k$–1) can be formed through the same process as that of the formation of the source region and the drain region. When the MOSIC manufacturing process having the various processings includes the drain extension or LDD process, this may also be applied thereto.

Since there is no need for any interconnection to the intermediate regions, there is also no need to provide contact holes in a high impurity region such as the source/drain region, and hence an area in this portion can be held to a minimum.

The present invention can also be applied to the transistor having the LDD or drain extension structure.

The present invention is applied to a high voltage operating field effect transistor formed in a semiconductor substrate, a high voltage operating field effect transistor formed in a so-called semiconductor-on-insulator (SOI) substrate having a semiconductor thin film formed on a surface of a supporting substrate and insulated from the supporting substrate, a glass substrate, an organic sheet, or the like, and a high voltage operating field effect transistor formed in a semiconductor-on-nothing (SON) having a semiconductor thin film insulated from a support substrate held over a cavity from the left- and right-hand sides.

Embodiment 1 of a bias electric potential generating circuit (hereinafter referred to as "a bias circuit" for short) for the high voltage operating field effect transistor of the present invention includes at least an adder having at least two inputs and one output, in which: an electric potential which changes according to increase or decrease in a drain electric potential is supplied to one of the two inputs, and a specified electric potential is supplied to the other of the two inputs; and an electric potential of the output of the adder is supplied as a bias electric potential to the drain side electrode.

Figure 7:
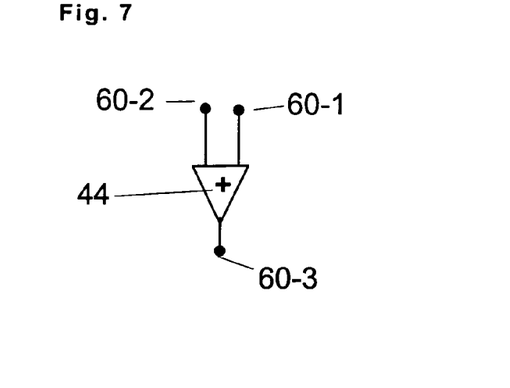
FIG. 7 is a schematic circuit diagram of a bias circuit of Embodiment 1 for supplying an electric potential to a high voltage operating field effect transistor of the present invention.

As shown in FIG. 7, an adder 44 is an arithmetic operation circuit for outputting a sum of electric potentials applied to input terminals 60-1 and 60-2, respectively, to an output terminal 60-3. Thus, when an electric potential Vd2 and Vg are supplied to one terminal 60-1 and the other terminal 60-2, respectively, the adder 44 outputs an electric potential of Vg+Vd2 (=Vd1) to the output terminal 60-3. The bias electric potential is supplied to the drain side electrode through the output terminal 60-3.

In Embodiment 1 of the bias circuit described above, even when the first constant electric potential Vs1 is supplied instead of Vg to the other input terminal 60-2 of the adder 44, the bias electric potential can be supplied to the drain side electrode of the high voltage operating field effect transistor of the present invention. In this case, a relationship of Vd1=Vs1+Vd2 is established. In the present invention, Vg and Vs1 are collectively referred to as a specified electric potential.

A high voltage power supply of the high voltage operating field effect transistor of the present invention is diverted to a power supply of the adder 44 in many cases. The technique of the present invention is applied to a transistor constituting this arithmetic operation circuit 44 as well, thereby allowing the high voltage to be outputted.

Figure 8:
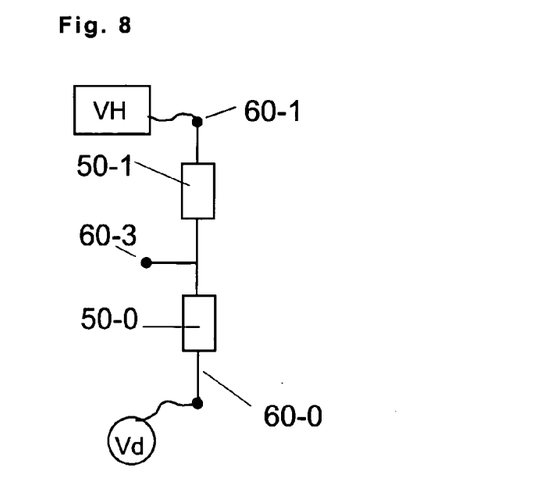
FIG. 8 is a schematic circuit diagram of a bias circuit of Embodiment 2 for supplying an electric potential to a high voltage operating field effect transistor of the present invention.

Embodiment 2 of a bias circuit having a simpler element configuration than that of the bias circuit of Embodiment 1 for supplying an electric potential to the drain side electrode of the high voltage operating field effect transistor of the present invention is shown as an example in FIG. 8. As apparent from FIG. 8, the bias circuit of Embodiment 2 includes at least two serial-connected resistors 50-0 and 50-1, in which an electric potential is supplied from the high voltage power source to one terminal 60-1 of the two serial-connected resistors 50-0 and 50-1, and the other terminal 60-0 thereof is connected to a drain; and a bias electric potential is supplied from a node 60-3 between the two serial-connected resistors 50-0 and 50-1 to the drain side electrode.

Note that in FIG. 8, symbol VH designates a high voltage power source electric potential, and a value in which VH×(the resistance value of the resistor on the drain side)/(the resistance value of the two serial-connected resistors) becomes Vs1 of the specified values is normally selected as a resistance value of the two serial-connected resistors.

In this bias circuit, if each of the resistance values of the resistors 50-0 and 50-1 is large, and the parasitic capacity connected to the node 60-3 is also large, the bias electric potential cannot follow a high speed change in electric potential of the drain region in some cases. In order to improve the transient response of the bias electric potential, a capacitive element having a larger capacitive value than that of the parasitic capacity can be connected between the nodes 60-0 and 60-3. This connection is topologically equivalent to the case where the capacitive element is connected between the drain region and the drain side electrode.

In the bias circuit of Embodiment 2, a current is caused to flow from the high voltage source to the drain. This state becomes a problem depending on the resistance values of the resistors in some cases. Embodiment 3 of a bias circuit which is free from the current flowing into the drain and which serves to supply an electric potential to the drain side electrode of the high voltage operating field effect transistor of the present invention is shown as an example in FIG. 9. As apparent from FIG. 9, the bias circuit of Embodiment 3 includes at least a rectifying device 43 and a resistor 50-2 connected in series with each other, in which a series connection end 60-0 on a rectifying device side is connected to the drain; the specified electric potential is supplied to a series connection end 60-2 on a resistor side; and a bias electric potential is supplied from a node 60-3 between the rectifying device 43 and the resistor 50-2 to the drain side electrode.

Figure 9:
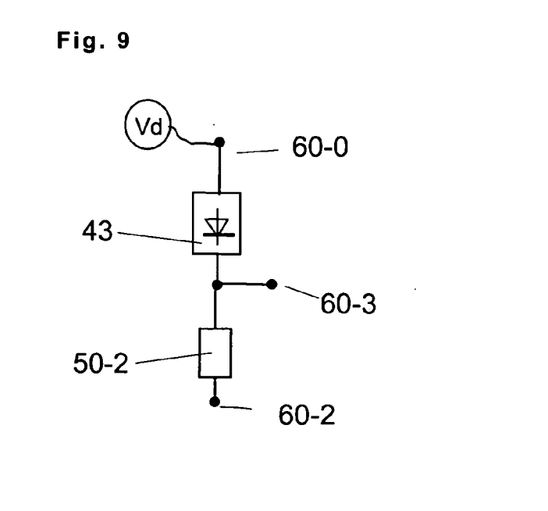
FIG. 9 is a schematic circuit diagram of a bias circuit of Embodiment 3 for supplying an electric potential to a high voltage operating field effect transistor of the present invention.

In Embodiment 3, as examples, the rectifying device 43 is realized by a pn junction diode, a Schottky diode, an equivalent rectifying device formed by connecting a drain and a gate of an insulated gate field effect transistor, or the like. The rectifying device 43 is provided in order to prevent the absolute value of the supplied electric potential from decreasing to a level equal to or lower than |Vg| or |Vs1| when the drain electric potential decreases to the vicinity of the grounding electric potential.

While the addition of the specified electric potential (Vg or Vs1) to the electric potential supplied to the series connection end 60-0 is omitted for the sake of simplicity, when a relationship of Vd>>Vg is established in this case, the high withstand voltage effect can be sufficiently attained. When the electric potential at the series connection end 60-0 becomes equal to or lower than the specified electric potential +Vf in the case where the addition of the specified electric potential is omitted, the electric potential at the series connection point 60-3 is fixed to about the specified electric potential. Here, symbol Vf designates a forward voltage of the rectifying device. When the rectifying device is realized by a field effect transistor having a gate and a drain connected to each other, the forward voltage Vf becomes a gate threshold voltage Vth43+ΔV of the insulated gate field effect transistor. ΔV is an increase amount in gate to source voltage corresponding to the current flowing through the resistor 50-2.

In this bias circuit, when the electric potential of the drain region changes from VH to Vs1 at a speed higher than the speed corresponding to a time constant determined by the capacitance value of the parasitic capacitance connected to the node 60-3 and the resistance value of the resistor 50-2, the transient response of the bias electric potential of the node 60-3 cannot follow the transient change of the electric potential of the drain region. In this case, a capacitive element having a larger capacitive value than that of the parasitic capacitance is connected between the nodes 60-0 and 60-3, whereby it is possible to improve the transient response of the bias electric potential. This connection is topologically equivalent to the case where the capacitive element is connected between the drain region and the drain side electrode.

On the other hand, if the transient change in electric potential of the drain region is large, the absolute value of the electric potential of the node 60-3 becomes smaller than that of Vs1 or the signal electric potential owing to the transient change in electric potential of the node 60-3 through the capacitive element in some cases. In order to avoid this state, one end of a rectifying device (different from the rectifying device 43) can be connected to the node 60-3, and a second constant electric potential can be supplied to the other end of the rectifying device. In order to prevent the absolute value of the electric potential of the node from becoming equal to or lower than that of the first constant electric potential, the absolute value of the second constant electric potential is set to a value which is obtained by subtracting a forward voltage of the rectifying device from the absolute value of the first constant electric potential.

This means can be applied not only to the bias circuit shown in FIG. 9, but also to the bias circuit shown in FIG. 8. In addition, this becomes topologically equivalent to the case where one end of the rectifying device is connected to the drain side electrode.

As one mode of a high voltage operating circuit to which the high voltage operating field effect transistor of the present invention is applied, there is provided a high voltage operating circuit element including at least: a first insulated gate field effect transistor; a second field effect transistor complementary to the first insulated gate field effect transistor; a first resistor having one end connected to a drain of the first insulated gate field effect transistor; and a second resistor having one end connected to a source of the first insulated gate field effect transistor, in which: a first electric potential is supplied to the other end of the first resistor, and a second electric potential is supplied to the other end of the second resistor; the second field effect transistor is the high voltage operating field effect transistor of one of the first and second solving means of the present invention; a source of the second field effect transistor is connected to the drain of the first insulated gate field effect transistor; the second electric potential is supplied to a drain side electrode of the second field effect transistor, and a source side electrode of the second field effect transistor is connected to the source of the first insulated gate field effect transistor; a gate of the first insulated gate field effect transistor is set as an input; and one point selected from the source and the drain of the first insulated gate field effect transistor is set as an output.

When the high voltage operating transistor according to a modification of the second solving means of the present invention is used, there is provided a high voltage operating circuit element including at least: a first insulated gate field effect transistor; a second field effect transistor complementary to the first insulated gate field effect transistor; a first resistor having one end connected to a drain of the first insulated gate field effect transistor; and a second resistor having one end connected to a source of the first insulated gate field effect transistor, in which a first electric potential is supplied to the other end of the first resistor, and a second electric potential is supplied to the other end of the second resistor; the second field effect transistor is a high voltage operating field effect transistor according to the modification of the second solving means of the present invention; a source of the second field effect transistor is connected to the drain of the first insulated gate field effect transistor; the second electric potential is supplied to a drain side electrode of the second field effect transistor, and a division gate nearest a source region of the second field effect transistor and the source side electrode are connected to the source of the first insulated gate field effect transistor; a gate of the first insulated gate field effect transistor is set as an input; and one point selected from the source and the drain of the first insulated gate field effect transistor is set as an output.

Figure 10:
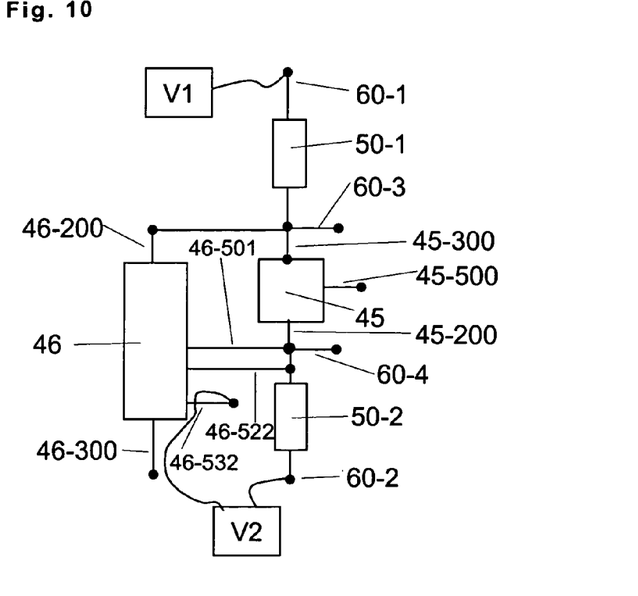
FIG. 10 is a circuit diagram, partly in block diagram, explaining connection of a high voltage operating circuit element of the present invention.

FIG. 10 shows a circuit diagram, partly in block diagram, explaining connection of a high voltage operating circuit element of the present invention. In the figure, reference numerals 50-1 and 50-2 designate the first resistor and the second resistor, respectively, reference numeral 45 designates the first insulated gate field effect transistor, and reference numerals 45-200, 45-300, and 45-500 designate the source, the drain, and the gate of the first insulated gate field effect transistor, respectively. Reference numeral 46 designates the second field effect transistor, and reference numerals 46-200, 46-300, 46-501, 46-522, and 46-532 designate the source and the drain of the second field effect transistor (high voltage operating field effect transistor) 46, and the division gate nearest the source region, and the source side electrode, and the drain side electrode of the gate, respectively. Reference numeral 60-1 designates the other end of the first resistor 50-1 to which the first electric potential V1 is supplied, and reference numeral 60-2 designates the other and of the second resistor 50-2 to which the second electric potential V2 is supplied. The second electric potential V2 is supplied to the drain side electrode 46-532 of the second field effect transistor.

When the second field effect transistor is the high voltage operating field effect transistor of the first and second solving means, the division gate 46-501 nearest the source region is not provided.

According to the above-mentioned high voltage operating circuit element, there are provided:

a high voltage operating circuit element in which a resistive gate between the source side and drain side electrodes is used instead of the second resistor, thus omitting the second resistor.

a high voltage operating circuit element in which at least one of the first and second resistors is composed of a plurality of serial-connected resistors, and a node between them is set as an output;

a high voltage operating circuit element in which the first resistor is composed of a plurality of serial-connected resistors, and the source of the second field effect transistor is connected to a node between them;

a high voltage operating circuit element in which the second resistor is composed of a plurality of serial-connected resistors, and at least one of the drain of the second field effect transistor, the source side electrode, and the drain side electrode is connected to a node between them;

a high voltage operating circuit element in which the drain of the second field effect transistor is connected to a second electric potential;

a high voltage operating circuit element in which the drain of the second field effect transistor is connected to a second electric potential through a third resistor;

a high voltage operating circuit element in which the drain of the second field effect transistor is connected to a third electric potential; and a high voltage operating circuit element in which one of the first and second resistors is set as a constant current element.

In addition thereto, various circuit elements as obtained through addition or modification by a person skilled in the art within the normal technical scope are included in the scope of the present invention.

In order to ensure the transient response characteristics of the high voltage operating circuit element a capacitive element is connected between the input and the source of the first insulated gate field effect transistor in many cases.

An offset (of a gate threshold voltage of the first insulated gate field effect transistor+$\Delta V$) occurs between an input and a source output of the first insulated gate field effect transistor of the high voltage operating circuit element. In order to reduce the offset, the first insulated gate field effect transistor can be made a field effect transistor of a depletion type. Here, $\Delta V$ is a necessary voltage drop corresponding to a current caused to flow through the second resistor, which is additionally required to a gate threshold voltage value across the gate and the source of the first insulated gate field effect transistor.

When, in the high voltage operating circuit element, the gate threshold voltage of the first insulated gate field effect transistor and the gate threshold voltage of the second field effect transistor are nearly equal in absolute value to each other, the offset occurring between the input and the drain output of the first insulated gate field effect transistor is nearly compensated for.

Note that in the high voltage operating circuit element, a third electric potential may be supplied to the drain of the second field effect transistor through one of an interconnection and a resistor.

In the bias circuit of Embodiment 2, the current from the bias circuit is caused to flow into the drain of the high voltage operating effect transistor of the present invention. In addition, in the bias circuit of Embodiment 3, the resistor of the bias circuit is added in parallel with the drain output resistor of the high voltage operating field effect transistor of the present invention. When those matters become a problem in terms of the performance or the product image, an insulated gate field effect transistor is introduced into the bias circuit, and a drain voltage is inputted to its gate, thereby solving this problem. The high voltage operating circuit element can be utilized on the basis of this bias circuit.

Embodiment 4 of a bias circuit utilizing the high voltage operating circuit element will hereinafter be described. That is, in its example shown in FIG. 11, in the high voltage operating circuit element, the first electric potential is set to a high voltage power supply electric potential VH, the second electric potential is set to the grounding electric potential, and the grounding electric potential is supplied to the drain of the second field effect transistor 46 through a third resistor 50-3.

Figure 11:
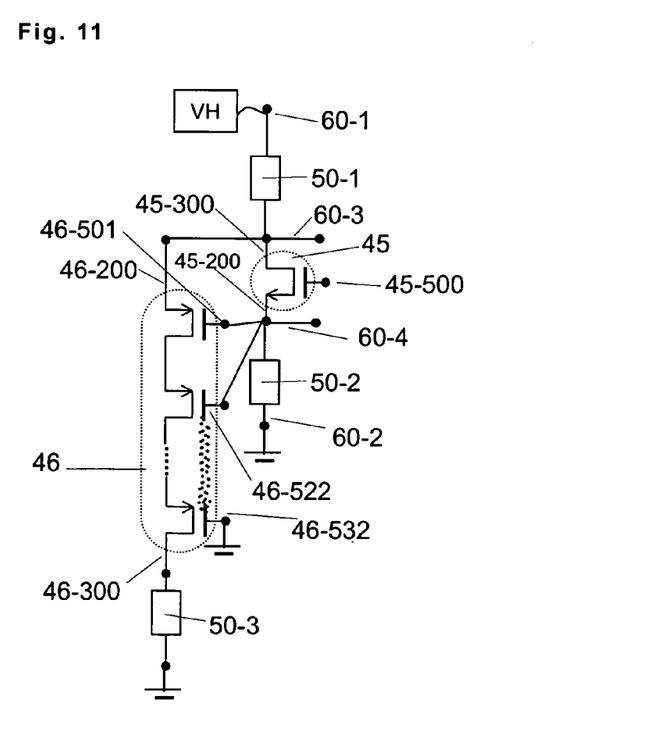
FIG. 11 is a schematic circuit diagram of a bias circuit of Embodiment 4 for supplying an electric potential to a high voltage operating field effect transistor of the present invention.

The gate 45-500 of the first insulated gate field effect transistor 45 is connected to the drain of the high voltage operating field effect transistor of the present invention, and the bias electric potential is supplied from the node 60-3 between the drain 45-300 of the first insulated gate field effect transistor 45 and the first resistor 50-1 to the drain side electrode of the high voltage operating field effect transistor of the present invention.

In FIG. 11, reference numeral 50-2 designates a second resistor, and reference numeral 45-200 designates a source of the first insulated gate field effect transistor. Reference numerals 46-200, 46-300, 46-501, 46-522, and 46-532 designates a source and a drain of the second field effect transistor (high voltage operating field effect transistor) 46, a division gate nearest the source region, and a source side electrode and a drain side electrode of the gate, respectively. When the second field effect transistor is the high voltage operating field effect transistor of the first and second solving means, the division gate 46-501 nearest the source region is unnecessary.

If a resistance value of the third resistor is expressed by (a resistance value of the first resistor)×(Vs1−Vth46−ΔV)/(VH−Vs1), when the drain voltage becomes a low electric potential, the electric potential supplied to the drain side electrode does not change from Vs1 towards the grounding electric potential. Here, (Vth46+ΔV) is a gate to source voltage required when a current expressed by (VH−Vs1)/(the resistance value of the first resistor) is caused to flow through the second field effect transistor.

Similar effects are obtained even when the third resistor is connected in series with the first resistor at the first insulated gate field effect transistor 45 side of the first resistor, and the bias electric potential is supplied from a node between them to the drain side electrode of the high voltage operating field effect transistor of the present invention. In this case, a third electric potential an absolute value of which is equal to or smaller than that of the second electric potential can be supplied to the drain of the second field effect transistor.

Similar effects are obtained even when the third resistor is removed, and the electric potential (Vs1−Vth46−ΔV) is supplied to the drain of the second field effect transistor 46.

In the high voltage operating circuit element and its modification, it is possible to configure a bias circuit for the high voltage operating field effect transistor of the present invention also when: a second electric potential is supplied to the drain of the second field effect transistor; one of the first and second electric potentials is set as an electric potential of the high voltage power supply, and the other thereof is set as one of the grounding electric potential and the specified electric potential; a gate of the first insulated gate field effect transistor is connected to a drain of the high voltage operating field effect transistor of the present invention; and a bias electric potential is supplied from the output to the drain side electrode.

In order to realize the resistor of the bias circuit of each of the embodiments of the present invention without newly adding a special manufacturing process or only with few modifications, it is possible to use a polycrystalline silicon resistor used in the analog MOSIC, an impurity layer formed on a substrate surface by diverting the ion implantation process for LDD or drain extension, or the like. A resistor having nearly the linear characteristics is desirably used as the resistor. However, for low power consumption applications requiring a high sheet resistance, it is possible to use a channel resistance of a field effect transistor, a semiconductor thin film formed on an insulating substrate such as an SOI substrate or a glass substrate, or an organic sheet, or the like. In this case, the resistor does not necessarily have the linear resistance characteristics.

The present invention includes a transistor a structure or a bias electric potential of which is changed within the known technical scope. Moreover, a composite transistor in which the structure of the present invention is incorporated is also included in the scope of the present invention. In addition, a bias circuit to which, in addition to the element described in the bias circuit of the present invention, an element such as a resistor, a capacitive element, or a transistor is added within the normal technical scope is also included in the scope of the present invention.

What is claimed is:

1. A method of high voltage operation of a field effect transistor, comprising the steps of:
   providing a field effect transistor that includes a substrate, a semiconductor channel formation region disposed in a surface of the substrate, a source region and a drain region which are spaced apart from each other with the semiconductor channel formation region disposed between the source region and the drain region, a gate insulating film region disposed on the semiconductor channel formation region, a resistive gate region disposed on the gate insulating film region, a source side electrode disposed on a source region side of the resistive gate region, and a drain side electrode disposed on a drain region side of the resistive gate region;
   supplying a signal electric potential to the source side electrode of the field effect transistor; and
   supplying to the drain side electrode of the field effect transistor, from a bias circuit, a bias electric potential an absolute value of which is equal to or larger than that of a specified electric potential and which changes according to an increase or decrease in a drain electric potential.

2. A method of high voltage operation of a field effect transistor according to claim 1; further comprising the step of supplying at least one of a signal electric potential and a signal current to the source region; and wherein the step of supplying the signal electric potential comprises supplying a first constant electric potential to the source side of the field effect transistor.

3. A method of high voltage operation of a field effect transistor according to claim 2; wherein the step of providing the field effect transistor further comprises providing a capacitive element connected between the drain region and the drain side electrode.

4. A method of high voltage operation of a field effect transistor according to claim 1; wherein the step of providing the field effect transistor further comprises providing a capacitive element connected between the drain region and the drain side electrode.

5. A method of high voltage operation of a field effect transistor according to claim 1; wherein in the step of providing the field effect transistor, the substrate comprises a semiconductor substrate.

6. A method of high voltage operation of a field effect transistor according to claim 1; wherein in the step of providing the field effect transistor, the substrate comprises a semiconductor thin film disposed on a surface of the supporting substrate and insulated from the supporting substrate.

7. A method of high voltage operation of a field effect transistor comprising:
   providing a field effect transistor that includes a substrate, a semiconductor channel formation region disposed in a surface of the substrate, a source region and a drain region which are spaced apart from each other with the semiconductor channel formation region disposed between the source region and the drain region, a gate insulating film region disposed on the semiconductor channel formation region, a resistive gate region disposed on the gate insulating film region, a source side electrode disposed on a source region side of the resistive gate region, and a drain side electrode disposed on a drain region side of the resistive gate region;
   supplying a signal electric potential to the source side electrode of the field effect transistor;
   providing a bias circuit comprised of an adder having at least two inputs and one output;
   supplying to one of the two inputs of the bias circuit an electric potential which changes according to an increase or decrease in a drain electric potential of the drain region of the field effect transistor;
   supplying to the other of the two inputs of the bias circuit a specified electric potential; and
   supplying to the drain side electrode of the field effect transistor an electric potential of the output of the adder as a bias electric potential.

8. A method of high voltage operation of a field effect transistor comprising:
   providing a field effect transistor that includes a substrate, a semiconductor channel formation region disposed in a surface of the substrate, a source region and a drain region which are spaced apart from each other with the semiconductor channel formation region disposed between the source region and the drain region, a gate insulating film region disposed on the semiconductor channel formation region, a resistive gate region disposed on the gate insulating film region, a source side electrode disposed on a source region side of the resistive gate region, and a drain side electrode disposed on a drain region side of the resistive gate region;
   supplying a signal electric potential to the source side electrode of the field effect transistor;
   providing a bias circuit comprised of at least two serial-connected resistors;
   supplying an electric potential of a high voltage power supply to one end of the two serial-connected resistors, the other end of the two serial-connected resistors being connected to the drain region of the field effect transistor; and
   supplying a bias electric potential from a node between the two serial-connected resistors to the drain side electrode of the field effect transistor.

9. A method of high voltage operation of a field effect transistor comprising:
   providing a field effect transistor that includes a substrate, a semiconductor channel formation region disposed in a surface of the substrate, a source region and a drain region which are spaced apart from each other with the semiconductor channel formation region disposed between the source region and the drain region, a gate insulating film region disposed on the semiconductor channel formation region, a resistive gate region disposed on the gate insulating film region, a source side electrode disposed on a source region side of the resistive gate region, and a drain side electrode disposed on a drain region side of the resistive gate region;
   supplying a signal electric potential to the source side electrode of the field effect transistor;
   providing a bias circuit comprised of a rectifying device and a resistor serially connected to the rectifying device, a connection end on a side of the rectifying device being connected to the drain region of the field effect transistor;
   supplying a specified electric potential to a connection end on a side of the resistor; and
   supplying a bias electric potential from a node between the rectifying device and the resistor to the drain side electrode of the field effect transistor.

10. A method of high voltage operation of a field effect transistor according to claim 7; wherein the bias electric potential supplied to the drain side electrode of the field effect transistor has an absolute value which is equal to or larger than that of a specified electric potential and which changes according to an increase or decrease in a drain electric potential.

11. A method of high voltage operation of a field effect transistor according to claim 8; wherein the bias electric potential supplied to the drain side electrode of the field effect transistor has an absolute value which is equal to or larger than that of a specified electric potential and which changes according to an increase or decrease in a drain electric potential.

12. A method of high voltage operation of a field effect transistor according to claim 9; wherein the bias electric potential supplied to the drain side electrode of the field effect transistor has an absolute value which is equal to or larger than that of a specified electric potential and which changes according to an increase or decrease in a drain electric potential.

* * * * *